(12) United States Patent
Oda et al.

(10) Patent No.: US 10,128,349 B2
(45) Date of Patent: Nov. 13, 2018

(54) SEMICONDUCTOR DEVICE

(71) Applicant: FLOSFIA INC., Kyoto-shi, Kyoto (JP)

(72) Inventors: Masaya Oda, Kyoto (JP); Rie Tokuda, Kyoto (JP); Hitoshi Kambara, Kyoto (JP); Katsuaki Kawara, Kyoto (JP); Toshimi Hitora, Kyoto (JP)

(73) Assignee: FLOSFIA INC., Kyoto-shi (JP)

( * ) Notice: Subject to any disclaimer, the term of this patent is extended or adjusted under 35 U.S.C. 154(b) by 0 days.

(21) Appl. No.: 15/381,894

(22) Filed: Dec. 16, 2016

(65) Prior Publication Data
US 2017/0179249 A1    Jun. 22, 2017

(30) Foreign Application Priority Data
Dec. 18, 2015    (JP) .................................. 2015-248071

(51) Int. Cl.

| | | |
|---|---|---|
| *H01L 29/43* | (2006.01) | |
| *H01L 29/47* | (2006.01) | |
| *H01L 29/66* | (2006.01) | |
| *H01L 29/872* | (2006.01) | |
| *H01L 29/04* | (2006.01) | |

(Continued)

(52) U.S. Cl.
CPC .......... *H01L 29/47* (2013.01); *H01L 21/0242* (2013.01); *H01L 21/02414* (2013.01); *H01L 21/02565* (2013.01); *H01L 21/02576* (2013.01); *H01L 21/02581* (2013.01); *H01L 21/02628* (2013.01); *H01L 29/04* (2013.01); *H01L 29/24* (2013.01); *H01L 29/41* (2013.01);

(Continued)

(58) Field of Classification Search
CPC .......................... H01L 29/66007; H01L 29/68
See application file for complete search history.

(56) References Cited

U.S. PATENT DOCUMENTS

| | | |
|---|---|---|
| 2008/0142795 A1 | 6/2008 | Ichinose |
| 2009/0096053 A1 | 4/2009 | Tsuchida et al. |

(Continued)

FOREIGN PATENT DOCUMENTS

| | | |
|---|---|---|
| EP | 2 320 465 A1 | 5/2011 |
| JP | 2005-260101 A | 9/2005 |

(Continued)

OTHER PUBLICATIONS

Taiwanese Office Action dated Sep. 21, 2017, issued in corresponding Taiwanese Application No. 105141644, filed Dec. 15, 2016, 11 pages.

(Continued)

*Primary Examiner* — Cheung Lee
(74) *Attorney, Agent, or Firm* — Christensen O'Connor Johnson Kindness PLLC

(57) ABSTRACT

A semiconductor device is provided that is excellent in semiconductor properties and Schottky characteristics. A semiconductor device includes: a semiconductor layer containing a crystalline oxide semiconductor with a corundum structure as a major component; and a Schottky electrode on the semiconductor layer, wherein the Schottky electrode is formed by containing a metal of Groups 4-9 of the periodic table, thereby manufacturing a semiconductor device excellent in semiconductor properties and Schottky characteristics without impairing the semiconductor properties to use the semiconductor device thus obtained for a power device and the like.

21 Claims, 18 Drawing Sheets

(51) Int. Cl.
    *H01L 29/24*    (2006.01)
    *H01L 29/41*    (2006.01)
    *H01L 21/02*    (2006.01)

(52) U.S. Cl.
    CPC ........ *H01L 29/43* (2013.01); *H01L 29/66969* (2013.01); *H01L 29/872* (2013.01)

(56) References Cited

U.S. PATENT DOCUMENTS

| | | |
|---|---|---|
| 2014/0175559 A1 | 6/2014 | Hung et al. |
| 2014/0239452 A1* | 8/2014 | Sasaki .................. C30B 29/16 257/613 |
| 2014/0332823 A1 | 11/2014 | Takizawa et al. |
| 2015/0325659 A1 | 11/2015 | Hitora et al. |
| 2016/0043238 A1 | 2/2016 | Takizawa et al. |
| 2016/0322467 A1 | 11/2016 | Takizawa et al. |
| 2017/0162655 A1 | 6/2017 | Takizawa et al. |

FOREIGN PATENT DOCUMENTS

| | | |
|---|---|---|
| JP | 2007-220889 A | 8/2007 |
| JP | 2009-081468 A | 4/2009 |
| JP | 2013-012760 A | 1/2013 |
| KR | 10-2014-0095080 A | 7/2014 |
| TW | 201427035 A | 7/2014 |

OTHER PUBLICATIONS

Akaiwa, K., and S. Fujita, "Electrical Conductive Corundum-Structured $\alpha$-$Ga_2O_3$ Thin Films on Sapphire With Tin-Doping Grown by Spray-Assisted Mist Chemical Vapor Deposition," Japanese Journal of Applied Physics 51:070203-1-070203-3, 2012.

Extended European Search Report dated May 18, 2017, issued in corresponding European Application No. 16204582.7, filed Dec. 16, 2016, 9 pages.

Oda, M., et al., "Vertical Schottky Barrier Diodes of $\alpha$-$Ga_2O_3$ Fabricated by Mist Epitaxy," Proceedings of the 73rd Annual Device Research Conference (DRC), Columbus, Ohio, Jun. 21-24, 2015, pp. 137-138.

Sasaki, K., et al., "Si-Ion Implantation Doping in $\beta$-$Ga_2O_3$ and Its Application to Fabrication of Low-Resistance Ohmic Contacts," Applied Physics Express 6:086502-1-086502-4, Aug. 2013.

Zhao, J.L., et al., "UV and Visible Electroluminescence From a Sn:$Ga_2O_3$/n+--Si Heterojunction by Metal—Organic Chemical Vapor Deposition," IEEE Transactions on Electron Devices 58(5):1447-1451, May 2011.

Korean Office Action dated Jun. 21, 2017, issued in corresponding Korean Application No. 10-2016-0172275, filed Dec. 16, 2016, 14 pages.

Notification of Reason for Refusal dated Jun. 14, 2018, issued in corresponding Korean Application No. 10-2016-0172275, filed Dec. 16, 2016, 16 pages.

\* cited by examiner

SEMICONDUCTOR DEVICE

TECHNICAL FIELD

The present invention relates to a semiconductor device particularly useful for a power device.

BACKGROUND ART

Gallium oxide ($Ga_2O_3$) is a transparent semiconductor that has a band gap as wide as 4.8-5.3 eV at room temperature and absorbs almost no visible light and ultraviolet light. It is accordingly a promising material for use in optical and electronic devices and transparent electronics operated particularly in a deep ultraviolet region. In recent years, photodetectors, light emitting diodes (LED), and transistors based on gallium oxide ($Ga_2O_3$) have been developed (refer to NPL 1).

Gallium oxide ($Ga_2O_3$) has five crystal structures of α, β, γ, δ, and ε, and generally the most stable structure is β-$Ga_2O_3$. However, having a β-gallic structure, β-$Ga_2O_3$ is not always preferred to be used in semiconductor devices, different from crystal systems generally used in electronic materials and the like. Growth of a β-$Ga_2O_3$ thin film requires a high substrate temperature and a high degree of vacuum, causing a problem of an increase in manufacturing costs. As described in NPL 2, in β-$Ga_2O_3$, even a high concentration (e.g., $1 \times 10^{19}/cm^3$ or more) dopant (Si) had to be annealed at high temperatures from 800° C. to 1100° C. after ion implantation to be used as a donor.

In contrast, having a crystal structure same as that of a sapphire substrate already sold for general purposes, α-$Ga_2O_3$ is accordingly preferred to be used in optical and electronic devices. It further has a band gap wider than that of β-$Ga_2O_3$, and thus is particularly useful for a power device and semiconductors device using α-$Ga_2O_3$ as the semiconductor are expected.

PTLs 1 and 2 discloses semiconductor devices that use β-$Ga_2O_3$ as a semiconductor and use an electrode, to obtain ohmic characteristics compatible with it, with two layers of a Ti layer and an Au layer, three layers of a Ti layer, an Al layer, and an Au layer, or four layers of a Ti layer, an Al layer, a Ni layer, and an Au layer.

PTL 3 discloses a semiconductor device that uses β-$Ga_2O_3$ as a semiconductor and uses any one of Au, Pt, or a laminate of Ni and Au as an electrode to obtain Schottky characteristics compatible with the semiconductor.

Unfortunately, application of the electrodes in PTLs 1 to 3 to a semiconductor device that uses α-$Ga_2O_3$ as a semiconductor causes a problem, such as not functioning as a Schottky electrode or an ohmic electrode, failing to attach the electrode to the film, and impairing semiconductor properties.

CITATION LIST

Patent Literature

PTL 1: JP 2005-260101A
PTL 2: JP 2009-81468A
PTL 3: JP 2013-12760A

Non Patent Literature

NPL 1: Jun Liang Zhao et al, "UV and Visible Electroluminescence from a Sn:Ga2O3/n+-Si Heterojunction by Metal-Organic Chemical Vapor Deposition", IEEE TRANSACTIONS ON ELECTRON DEVICES, VOL. 58, NO. 5 May 2011

NPL 2: Kohei Sasaki et al, "Si-Ion Implantation Doping in β-Ga2O3 and Its Application to Fabrication of Low-Resistance Ohmic Contacts", Applied Physics Express 6 (2013) 086502

SUMMARY OF THE INVENTION

Technical Problem

It is an object of the present invention to provide a semiconductor device excellent in semiconductor properties and Schottky characteristics.

Solution to Problem

As a result of keen examination to achieve the object, the present inventors learned that a semiconductor device, including at least: a semiconductor layer containing a crystalline oxide semiconductor with a corundum structure as a major component; and a Schottky electrode on the semiconductor layer, wherein the Schottky electrode contains metal of the Group 4 of the periodic table is excellent in semiconductor properties and excellent in Schottky characteristics without impairing the semiconductor properties of the crystalline oxide semiconductor with a corundum structure. They then found that such a semiconductor device is capable of solve the conventional problems at once.

After learning the above findings, the present inventors have made further research to complete the present invention.

That is, the present invention relates to the following inventions.

[1] A semiconductor device, including:
  a semiconductor layer containing a crystalline oxide semiconductor with a corundum structure as a major component; and
  a Schottky electrode on the semiconductor layer, wherein
  the Schottky electrode contains at least one metal selected from Groups 4-9 of the periodic table.
[2] The semiconductor device of [1] above, wherein the Schottky electrode contains at least one metal selected from Groups 4-6 of the periodic table.
[3] The semiconductor device of [1] above, including:
  a first semiconductor layer;
  a second semiconductor layer; and
  a Schottky electrode on the first semiconductor layer, wherein
  each of the first semiconductor layer and the second semiconductor layer contains a crystalline oxide semiconductor with a corundum structure as a major component,
  the first semiconductor layer has a carrier concentration less than a carrier concentration of the second semiconductor layer, and
  the Schottky electrode contains at least one metal selected from Groups 4-9 of the periodic table.
[4] The semiconductor device of [1] above, wherein the metal is a transition metal of the fourth period of the periodic table.
[5] The semiconductor device of [1] above, wherein the crystalline oxide semiconductor contains gallium or indium.

[6] The semiconductor device of [1] above, wherein the crystalline oxide semiconductor is α-Ga$_2$O$_3$ or a mixed crystal thereof.

[7] The semiconductor device of [1] above, further comprising an ohmic electrode, wherein the ohmic electrode contains a metal of Group 4 or 11 of the periodic table.

[8] A semiconductor device, including:
 a semiconductor layer containing a crystalline oxide semiconductor with a corundum structure as a major component; and
 a Schottky electrode on the semiconductor layer, wherein
 the semiconductor layer has a thickness of 40 μm or less.

[9] The semiconductor device of [8] above, wherein a capacitance measured at 1 MHz is 1000 pF or less at 0 V bias.

[10] The semiconductor device of [8] above, wherein the semiconductor layer has a surface area of 1 mm$^2$ or less.

[11] The semiconductor device of [8] above, wherein the Schottky electrode has an area of 1 mm$^2$ or less.

[12] The semiconductor device of [8] above, wherein a current of 1 A or more flows.

[13] The semiconductor device of [1] above, wherein the semiconductor device is a power device.

[14] The semiconductor device of [1] above, wherein the semiconductor device is a power module, an inverter, or a converter.

[15] A semiconductor system comprising a semiconductor device, wherein the semiconductor device is the semiconductor device of [1] above.

Advantageous Effects of Invention

The semiconductor device of the present invention is excellent in semiconductor properties and Schottky characteristics.

DESCRIPTION OF EMBODIMENTS

Figure 1:
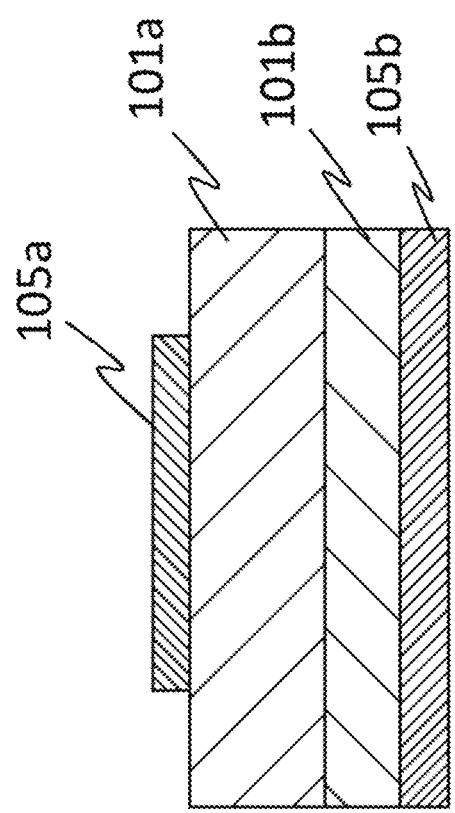
FIG. 1 is a diagram schematically illustrating a preferred example of a Schottky barrier diode (SBD) of the present invention.

A semiconductor device of the present invention includes at least: a semiconductor layer containing a crystalline oxide semiconductor with a corundum structure as a major component; and a Schottky electrode on the semiconductor layer, wherein the Schottky electrode contains at least one metal selected from Groups 4-9 of the periodic table. The metal is preferably at least one metal selected from Groups 4-6 of the periodic table. Such combination of the metal material for the Schottky electrode with the semiconductor material for the semiconductor layer enables obtaining a semiconductor device excellent in semiconductor properties. It has been conventionally known that, when β-Ga$_2$O$_3$ is used as a semiconductor, a metal of Groups 10 or more of the periodic table, such as Au, Pt, and Ni, is suitably used for a Schottky electrode. However, even without using the metal of Groups 10 or more of the periodic table, when a crystalline oxide semiconductor with a corundum structure, such as α-Ga$_2$O$_3$ for example, is used, use of at least one metal selected from Groups 4-9 of the periodic table for the Schottky electrode enables obtaining a semiconductor device excellent in semiconductor properties.

Another semiconductor device of the present invention is a semiconductor element includes at least: a semiconductor layer containing a crystalline oxide semiconductor with a corundum structure as a major component; and a Schottky electrode on the semiconductor layer, wherein the Schottky electrode contains a metal of Group 4 of the periodic table. The metal of Group 4 of the periodic table is thus contained in the Schottky electrode for better adhesion.

The semiconductor layer is not particularly limited as long as a crystalline oxide semiconductor with a corundum structure is contained as a major component. The semiconductor layer (hereinafter, may be referred to as "a crystalline oxide semiconductor film") preferably contains an InAlGaO-based semiconductor as a major component, more preferably contains at least gallium or indium, and most preferably contains at least gallium. Preferred examples of the crystalline oxide semiconductor containing at least gallium include α-Ga$_2$O$_3$ or a mixed crystal thereof. The "major component" means to contain α-Ga$_2$O$_3$, in an example where the crystalline oxide semiconductor is α-Ga$_2$O$_3$, at an atomic ratio of gallium of 0.5 or more in the metal element in the film. In the present invention, the atomic ratio of gallium in the metal element in the film is preferably 0.7 or more and more preferably 0.8 or more. The thickness of the crystalline oxide semiconductor film is not particularly limited and may be 1 μm or less or 1 μm or more. In the present invention, the thickness is preferably 40 μm or less, more preferably 25 μm or less, even more preferably 12 μm or less, and most preferably 8 μm or less. The surface area of the crystalline oxide semiconductor film is not particularly limited, and it is preferably 1 $mm^2$ or less and more preferably 1 mm square or less. As clearly seen from results of thermal resistance calculation evaluation described below, the semiconductor device of the present invention exhibits excellent performance as a semiconductor device even being downsized. For example, a semiconductor device flowing a current of 1 A or more (preferably 10 A or more) is obtained even when the crystalline oxide semiconductor film has a film thickness of 12 μm or less and a surface area of 1 mm square or less. The crystalline oxide semiconductor film is generally monocrystalline while it may be polycrystalline. The crystalline oxide semiconductor film may be a single layer film or may be a multilayer film. When the crystalline oxide semiconductor film is a multilayer film, the multilayer film preferably has a film thickness of 40 μm or less. When the crystalline oxide semiconductor film is a multilayer film including at least a first semiconductor layer and a second semiconductor layer and a Schottky electrode is provided on the first semiconductor layer, the multilayer film preferably has a carrier concentration of the first semiconductor layer less than a carrier concentration of the second semiconductor layer. In this case, the second semiconductor layer generally contains a dopant, and the carrier concentration of the crystalline oxide semiconductor film is appropriately set by adjusting the amount of doping.

The crystalline oxide semiconductor film preferably contains a dopant. The dopant is not particularly limited and may be a known one. Examples of the dopant include n-type dopant, such as tin, germanium, silicon, titanium, zirconium, vanadium or niobium, or p-type dopant. In the present invention, the dopant is preferably Sn. Sn content in composition of the crystalline oxide semiconductor film is preferably 0.00001 atom %, more preferably from 0.00001 atom % to 20 atom %, and most preferably from 0.00001 atom % to 10 atom %.

The crystalline oxide semiconductor film is preferably obtained by, for example, atomization or droplet formation of a raw-material solution (atomization and droplet formation step), carrying the mist or droplets thus obtained onto a base with a carrier gas (delivery step), and then laminating a crystalline oxide semiconductor film containing the crystalline oxide semiconductor as a major component on the base (film formation step) by a thermal reaction of the mist or droplets in a film formation chamber.

(Atomization and Droplet Formation Step)

In the atomization and droplet formation step, the raw-material solution is subjected to atomization or droplet formation. A means of atomizing or forming droplets from the raw-material solution is not particularly limited as long as it is capable of atomizing or forming droplets from the raw-material solution, and it may be a known means. In the present invention, an atomizing or droplet-formation means using ultrasonic waves is preferred. The mist or droplets obtained using ultrasonic waves are preferred because they have an initial rate of zero to be suspended in the air. Such mist is capable of suspended in a space to be delivered as a gas, not being blown like a spray, for example, and not damaged by collision energy, thereby being preferred very much. The droplet size is not particularly limited and the droplets may be of approximately several mm. The droplets are preferably 50 μm or less and more preferably from 100 nm to 10 μm.

(Raw-Material Solution)

The raw-material solution is not particularly limited as long as it contains a material enabling atomization or droplet formation and also contains deuterium, and may be an inorganic or organic material. In the present invention, the solution is preferably metal or a metal compound, and more preferably contains one or more types of metal selected from gallium, iron, indium, aluminum, vanadium, titanium, chromium, rhodium, nickel, cobalt, zinc, magnesium, calcium, silicon, yttrium, strontium, and barium.

In the present invention, as the raw-material solution, those having the metal in the form of complex or salt dissolved or dispersed in an organic solvent or water are preferably used. Examples of the form of the complex include acetylacetonato complexes, carbonyl complexes, ammine complexes, hydrido complexes, and the like. Examples of the form of the salt include organic metal salts (e.g., metal acetate, metal oxalate, metal citrate, etc.), metal sulfide salt, metal nitrate salt, metal phosphate salt, metal halide salt (e.g., metal chloride salt, metal bromide salt, metal iodide salt, etc.), and the like.

To the raw-material solution, an additive, such as hydrohalic acid and an oxidant, is preferably mixed. Examples of the hydrohalic acid include hydrobromic acid, hydrochloric acid, hydroiodic acid, and the like, and among all, hydrobromic acid or hydroiodic acid is preferred for the reason of obtaining a film of better quality. Examples of the oxidant include: peroxides, such as hydrogen peroxide ($H_2O_2$), sodium peroxide ($Na_2O_2$), barium peroxide ($BaO_2$), and benzoyl peroxide ($(C_6H_5CO)_2O_2$); hypochlorous acid (HClO); perchloric acid; nitric acid; ozone water; organic peroxides, such as peracetic acid and nitrobenzene; and the like.

The raw-material solution may contain a dopant. The dopant contained in the raw-material solution enables good doping. The dopant is not particularly limited as long as the objects of the present invention are not impaired. Examples of the dopant include n-type dopants, such as tin, germanium, silicon, titanium, zirconium, vanadium, and niobium, p-type dopants, and the like. The dopant concentration in general may be approximately from $1\times10^{16}/cm^3$ to $1\times10^{22}/cm^3$, or the dopant concentration may be at low concentration of, for example, approximately $1\times10^{17}/cm^3$ or less. According to the present invention, the dopant may be contained at high concentration of approximately $1\times10^{20}/cm^3$ or more.

The solvent of the raw-material solution is not particularly limited. The solvent may be an inorganic solvent, such as water, or may be an organic solvent, such as alcohol, or may be a mixed solvent of the inorganic solvent and the organic solvent. In the present invention, the solvent preferably contains water and is more preferably water or a mixed solvent of water and alcohol.

(Delivery Step)

In the delivery step, the mist or the droplets are delivered into a film formation chamber with a carrier gas. The carrier gas is not particularly limited as long as the objects of the present invention are not impaired. Preferred examples include an inert gas, such as oxygen, ozone, nitrogen, and argon, and a reducing gas, such as a hydrogen gas and a forming gas. The type of carrier gas may be one or more, and a dilution gas at a reduced flow rate (e.g., 10-fold dilution gas) and the like may be used further as a second carrier gas. The carrier gas may be supplied from one or more locations.

While the flow rate of the carrier gas is not particularly limited, it is preferably from 0.01 to 20 L/min. and more preferably from 1 to 10 L/min. When a dilution gas is used, the flow rate of the dilution gas is preferably from 0.001 to 2 L/min. and more preferably from 0.1 to 1 L/min.

(Film Formation Step)

In the film formation step, the mist or the droplets are subjected to a thermal reaction in a film formation chamber for formation of a crystalline oxide semiconductor film on the base. The thermal reaction may be in any form as long as the mist or the droplets react on heating, and reaction conditions are also not particularly limited as long as the objects of the present invention are not impaired. In the present step, the thermal reaction is usually carried out at an evaporation temperature of the solvent. The temperature is preferably not too high (e.g., 1000° C. or less), more preferably 650° C. or less, and most preferably from 300° C. to 650° C. The thermal reaction may be carried out, as long as the objects of the present invention are not impaired, in any of vacuum, a non-oxygen atmosphere, a reducing gas atmosphere, and an oxygen atmosphere, whereas it is preferably carried out in a non-oxygen atmosphere or an oxygen atmosphere. While it may also be carried out in any condition of under atmospheric pressure, increased pressure, and reduced pressure, it is preferably carried out under atmospheric pressure in the present invention. The film thickness can be set by adjusting the film formation time.

(Base)

The base is not particularly limited as long as it is capable of supporting the crystalline oxide semiconductor film. The material for the base is also not particularly limited as long as the objects of the present invention are not impaired, and it may be a known base and may be an organic or inorganic compound. The base may be in any shape and is valid for all shapes. Examples of the shape of the base include a plate shape, such as a flat plate and a disk, a fibrous shape, a rod shape, a cylindrical shape, a prismatic shape, a tubular shape, a spiral shape, a spherical shape, and a ring shape, and a substrate is preferred in the present invention. The thickness of the substrate is not particularly limited in the present invention.

The substrate is in a plate shape and is not particularly limited as long as it becomes a support for the crystalline oxide semiconductor film. It may be an insulating substrate, a semiconductor substrate, a metal substrate, or a conductive substrate. The substrate is preferably an insulating substrate and preferably a substrate having a metal film on a surface thereof. The metal film is preferably a multilayer film. Examples of the substrate include a base substrate containing a substrate material with a corundum structure as a major component, a base substrate containing a substrate material with a β-gallic structure as a major component, a base substrate containing a substrate material with a hexagonal structure as a major component, and the like. The "major component" in this context means to contain a substrate material with the specific crystal structure, based on the entire components of the substrate material, at an atomic ratio of preferably 50% or more, more preferably 70% or more, and even more preferably 90% or more, and possibly 100%.

The substrate material is not particularly limited as long as the objects of the present invention are not impaired, and may be a known one. Preferred examples of the substrate material with a corundum structure include $\alpha$-$Al_2O_3$ (sapphire substrate) and $\alpha$-$Ga_2O_3$, and more preferred examples include an a-plane sapphire substrate, an m-plane sapphire substrate, an r-plane sapphire substrate, a c-plane sapphire substrate, an a gallium oxide substrate (a-plane, m-plane, or r-plane), and the like. Examples of the base substrate containing the substrate material with a β-gallic structure as a major component include a β-$Ga_2O_3$ substrate, a mixed crystal substrate containing $Ga_2O_3$ and $Al_2O_3$, where $Al_2O_3$ is more than 0 wt % and 60 wt % or less, and the like. Examples of the base substrate containing the substrate material with a hexagonal structure as a major component include a SiC substrate, a ZnO substrate, a GaN substrate, and the like. The metal used for the substrate material is not particularly limited while metal used for a following first metal layer or a following second metal layer is preferred.

In the present invention, the base preferably has metal or a corundum structure in all or a part of a surface thereof. When the base has a corundum structure, the base is more preferably a base substrate containing the substrate material with a corundum structure as a major component, and most preferably a sapphire substrate or an a gallium oxide substrate. The base may contain aluminum, and in this case, the base substrate preferably contains an aluminum containing substrate material with a corundum structure as a major component, and more preferably a sapphire substrate (preferably, a c-plane sapphire substrate, an a-plane sapphire substrate, an m-plane sapphire substrate, or an r-plane sapphire substrate). In addition, the base is preferably one containing oxide. Examples of the oxide include a YSZ substrate, an $MgAl_2O_4$ substrate, a ZnO substrate, a MgO substrate, an $SrTiO_3$ substrate, an $Al_2O_3$ substrate, a quartz substrate, a glass substrate, a β gallium oxide substrate, a barium titanate substrate, a strontium titanate substrate, a cobalt oxide substrate, a copper oxide substrate, a chromium oxide substrate, an iron oxide substrate, a $Gd_3Ga_5O_{12}$ substrate, a potassium tantalate substrate, a lanthanum aluminate substrate, a lanthanum strontium aluminate substrate, a lanthanum strontium gallate substrate, a lithium niobate substrate, a tantalate lithium substrate, lanthanum strontium aluminum tantalate, a manganese oxide substrate, a neodymium gallate substrate, a nickel oxide substrate, a scandium magnesium aluminate substrate, strontium oxide, a strontium titanate substrate, a tin oxide substrate, a tellurium oxide substrate, a titanium oxide substrate, a YAG substrate, a yttrium aluminate substrate, a lithium aluminate substrate, a lithium gallate substrate, a LAST substrate, a neodymium gallate substrate, a yttrium orthovanadate substrate, and the like.

In the present invention, after the film formation step, annealing may be performed. The annealing temperature is not particularly limited as long as the objects of the present invention are not impaired, and is generally from 300° C. to 650° C. and preferably from 350° C. to 550° C. The annealing time is generally from 1 minute to 48 hours, preferably from 10 minutes to 24 hours, and more preferably from 30 minutes to 12 hours. The annealing may be performed in any atmosphere as long as the objects of the present invention are not impaired, and preferably in a non-oxygen atmosphere and more preferably in a nitrogen atmosphere.

In the present invention, the crystalline oxide semiconductor film may be provided directly on the substrate or may be provided via another layer, such as a buffer layer and a stress relief layer. Formation means of each layer is not particularly limited and may be known means, and mist CVD is preferred in the present invention.

In the present invention, the crystalline oxide semiconductor film may be used for the semiconductor device as the semiconductor layer after using known means, such as separation from the base, or may be used for the semiconductor device directly as the semiconductor layer.

The semiconductor device includes at least: the semiconductor layer; and a Schottky electrode on the semiconductor layer. The Schottky electrode is not particularly limited as long as the electrode contains at least one metal selected from Groups 4-9 of the periodic table. Examples of the metal of Group 4 of the periodic table include titanium (Ti), zirconium (Zr), hafnium (Hf), and the like, and among all, Ti is preferred. Examples of the metal of Group 5 of the periodic table include vanadium (V), niobium (Nb), tantalum (Ta), and the like. Examples of the metal of Group 6 of the periodic table include one or more types of metal selected from chromium (Cr), molybdenum (Mo), and tungsten (W). In the present invention, Cr is preferred for better semiconductor properties, such as switching characteristics. Examples of the metal of Group 7 of the periodic table include manganese (Mn), technetium (Tc), rhenium (Re), and the like. Examples of the metal of Group 8 of the periodic table include iron (Fe), ruthenium (Ru), osmium (Os), and the like. Examples of the metal of Group 9 of the periodic table include cobalt (Co), rhodium (Rh), iridium (Ir), and the like. In the present invention, as long as the objects of the present invention are not impaired, the Schottky electrode may contain metal of Group 10 or 11 of the periodic table. Examples of the metal of Group 10 of the periodic table include nickel (Ni), palladium (Pd), platinum (Pt), and the like, and among all, Pt is preferred. Examples of the metal of Group 11 of the periodic table include copper (Cu), silver (Ag), gold (Au), and the like, and among all, Au is preferred.

In the present invention, for even better semiconductor properties, such as switching characteristics, the Schottky electrode preferably contains at least one metal selected from the Groups 4-6 of the periodic table or at least one metal selected from Groups 4-9 of the periodic table and contains a transition metal of the fourth period of the periodic table, and more preferably contains a metal of Group 4 or 6 of the periodic table or at least one metal selected from Groups 4-6 of the periodic table and contains a transition metal of the fourth period of the periodic table.

The Schottky electrode may be a metal layer of a single layer and may contain two or more metal films. A means of laminating the metal layer and the metal films is not particularly limited, and examples include known means, such as vacuum deposition and sputtering. The metal constituting the Schottky electrode may be alloy. In the present invention, the first metal layer preferably contains Ti and most preferably further contains Au or/and Pt. Use of such a preferred metal enables better semiconductor properties (e.g., durability, dielectric breakdown voltage, resistance voltage, on resistance, stability, etc.) of the semiconductor with a corundum structure and good development of Schottky characteristics.

In the present invention, the Schottky electrode preferably has an area of 1 mm$^2$ or less and more preferably 0.8 mm$^2$ or less.

The semiconductor device of the present invention generally includes an ohmic electrode. The ohmic electrode preferably contains metal of Group 4 or 11 of the periodic table. The preferred metal of Group 4 or 11 of the periodic table used for the ohmic electrode may be same as the metal contained in the Schottky electrode. The ohmic electrode may be a metal layer of a single layer or may contain two or more metal layers. The lamination means of the metal layers is not particularly limited, and examples include known means, such as vacuum deposition and sputtering. The metal constituting the ohmic electrode may be alloy. In the present invention, the ohmic electrode preferably contains Ti or/and Au and more preferably contains Ti and Au.

The semiconductor device is particularly useful for a power device. Examples of the semiconductor device include a semiconductor laser, a diode, a transistor (e.g., MESFET, etc.), and the like. Among all, a diode is preferred and a Schottky barrier diode is more preferred.

(SBD)

FIG. 1 illustrates a preferred example of the Schottky barrier diode (SBD) according to the present invention. A SBD in FIG. 1 includes an n-type semiconductor layer 101*a*, an n+type semiconductor layer 101*b*, a Schottky electrode 105*a*, and an ohmic electrode 105*b*.

The Schottky electrode and the ohmic electrode may be formed by known means, such as vacuum deposition and sputtering, for example. More specifically, for example, the Schottky electrode may be formed by laminating a first metal layer and patterning the first metal layer using photolithography.

The following description is given to respective embodiments of using a first metal layer as the Schottky electrode 105*a* and using a second metal layer as the ohmic electrode 105*b*.

Figure 3:
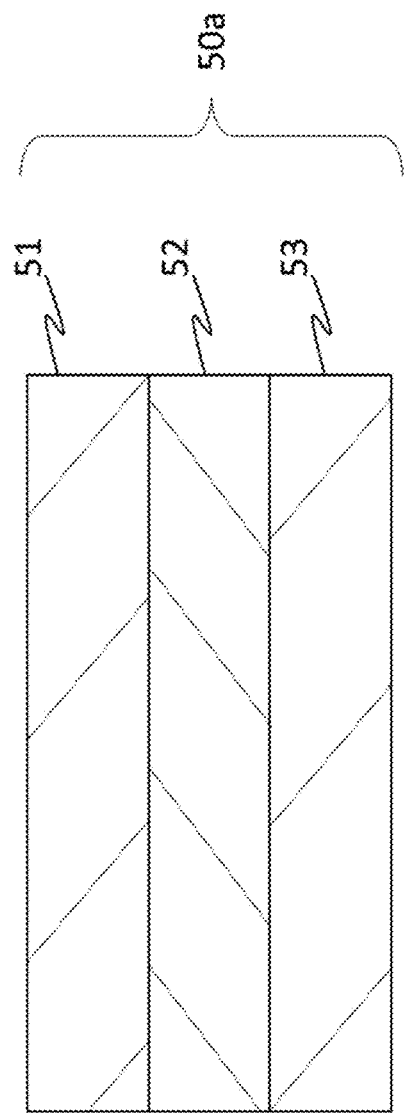
FIG. 3 is a diagram schematically illustrating a preferred example of a first metal layer used in the present invention.

FIG. 3 illustrates an example of a preferred first metal layer used in the present invention. A first metal layer 50*a* includes an Au layer 51, a Ti layer 52, and a Pt layer 53. Although the film thickness of the metal film of each layer is not particularly limited, the Au layer is preferably from 0.1 nm to 10 µm, more preferably from 5 nm to 200 nm, and most preferably from 10 nm to 100 nm. The metal (e.g., Ti, etc.) layer of Group 4 of the periodic table is preferably from 1 nm to 500 µm, more preferably from 1 nm to 100 µm, and most preferably from 5 nm to 20 nm or from 1 µm to 100 µm. The metal (e.g., Pt, etc.) layer of Group 10 of the periodic table is preferably, for example, from 1 nm to 10 µm. When Ag is used as the metal of Group 11 of the periodic table, the Ag film has a film thickness preferably from 5 µm to 100 µm, more preferably from 10 µm to 80 µm, and most preferably from 20 µm to 60 µm. When Cu is used as the metal of Group 11 of the periodic table, the Cu film has a film thickness preferably from 1 nm to 500 µm, more preferably from 1 nm to 100 µm, and most preferably from 0.5 µm to 5 µm.

Figure 4:
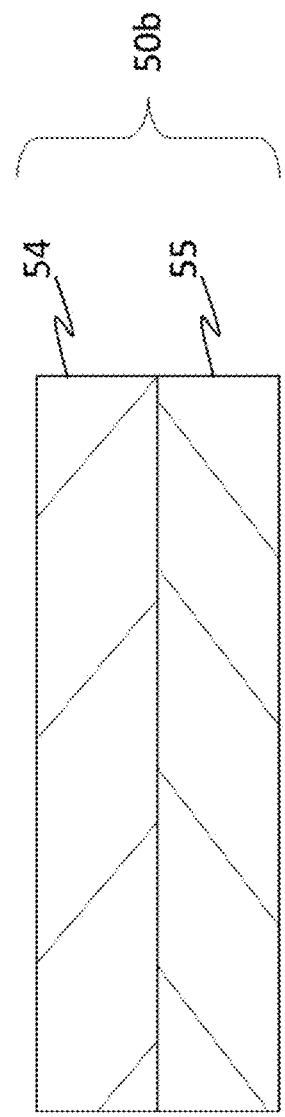
FIG. 4 is a diagram schematically illustrating a preferred example of a second metal layer used in the present invention.

FIG. 4 illustrates an example of a preferred second metal layer used in the present invention. A second metal layer 50*b* includes a Ti layer 54 and an Au layer 55. Although the film thickness of the metal film of each layer is not particularly limited, the Ti layer 54 is preferably from 1 nm to 500 µm, more preferably from 1 nm to 100 µm, and most preferably from 5 nm to 20 nm or from 1 µm to 100 µm. The Au layer 55 is preferably from 0.1 nm to 10 µm, more preferably from 5 nm to 200 nm, and most preferably from 10 nm to 100 nm.

Reverse bias is applied to the SBD in FIG. 1, a depletion layer, not shown, expands in the n-type semiconductor layer 101*a* to have a high voltage SBD. When a forward bias is applied, electrons flow from the ohmic electrode 105*b* to the Schottky electrode 105*a*. Such an SBD is excellent for high voltage and high current, has good Schottky characteristics and high switching speed, and excellent in resistance voltage and reliability.

Figure 2:
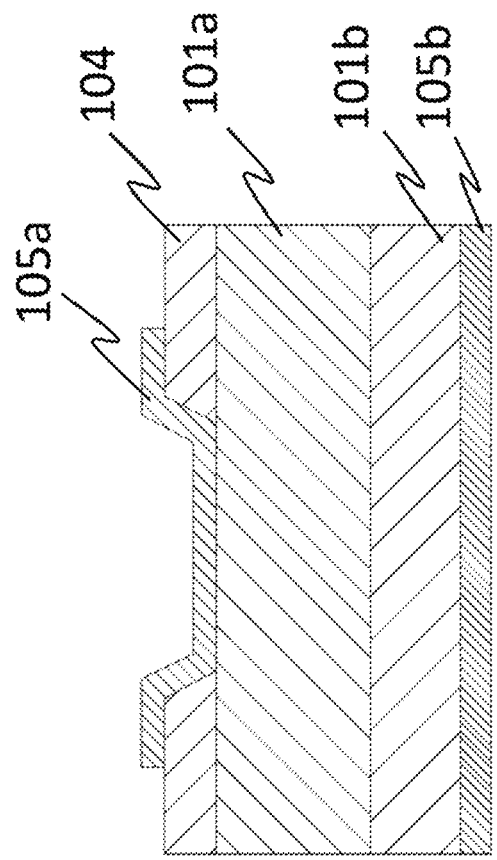
FIG. 2 is a diagram schematically illustrating another preferred example of a Schottky barrier diode (SBD) of the present invention.

FIG. 2 illustrates another preferred example of a Schottky barrier diode (SBD) according to the present invention. The SBD in FIG. 2 further includes an insulating layer 104 in addition to the configuration of the SBD in FIG. 1. More specifically, the SBD includes the n-type semiconductor layer 101a, the n+type semiconductor layer 101b, the Schottky electrode 105a, the ohmic electrode 105b, and the insulating layer 104.

Examples of the material for the insulating layer 104 include GaO, AlGaO, InAlGaO, AlInZnGaO$_4$, AlN, Hf$_2$O$_3$, SiN, SiON, Al$_2$O$_3$, MgO, GdO, SiO$_2$, Si$_3$N$_4$, and the like, and in the present invention, those having a corundum structure are preferred. Use of the insulator with a corundum structure for the insulating layer enables good development of functions of the semiconductor properties at the interface. The insulating layer 104 is provided between the n-type semiconductor layer 101a and the Schottky electrode 105a. The insulating layer 104 may be formed by known means, such as sputtering, vacuum deposition, and CVD, for example.

The other configuration and the like are same as those in the SBD in FIG. 1.

Compared with the SBD in FIG. 1, the SBD in FIG. 2 is even more excellent in insulating properties and has higher current controllability.

The semiconductor device obtained as above generally has a capacitance measured at 1 MHz of 1000 pF or less at 0 V bias, preferably 500 pF or less, and more preferably 150 pF or less, and the present invention includes such a semiconductor device.

Figure 12:
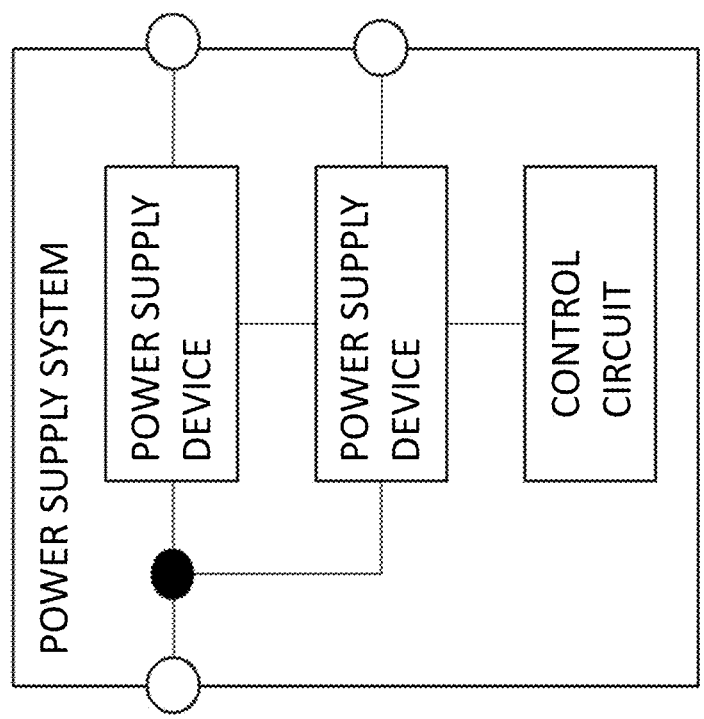
FIG. 12 is a diagram schematically illustrating a preferred example of a power supply system.
Figure 13:
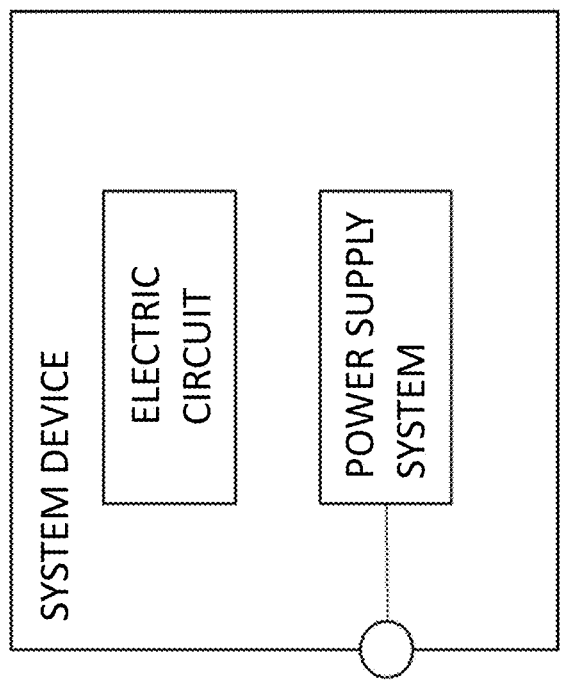
FIG. 13 is a diagram schematically illustrating a preferred example of a system device.
Figure 14:
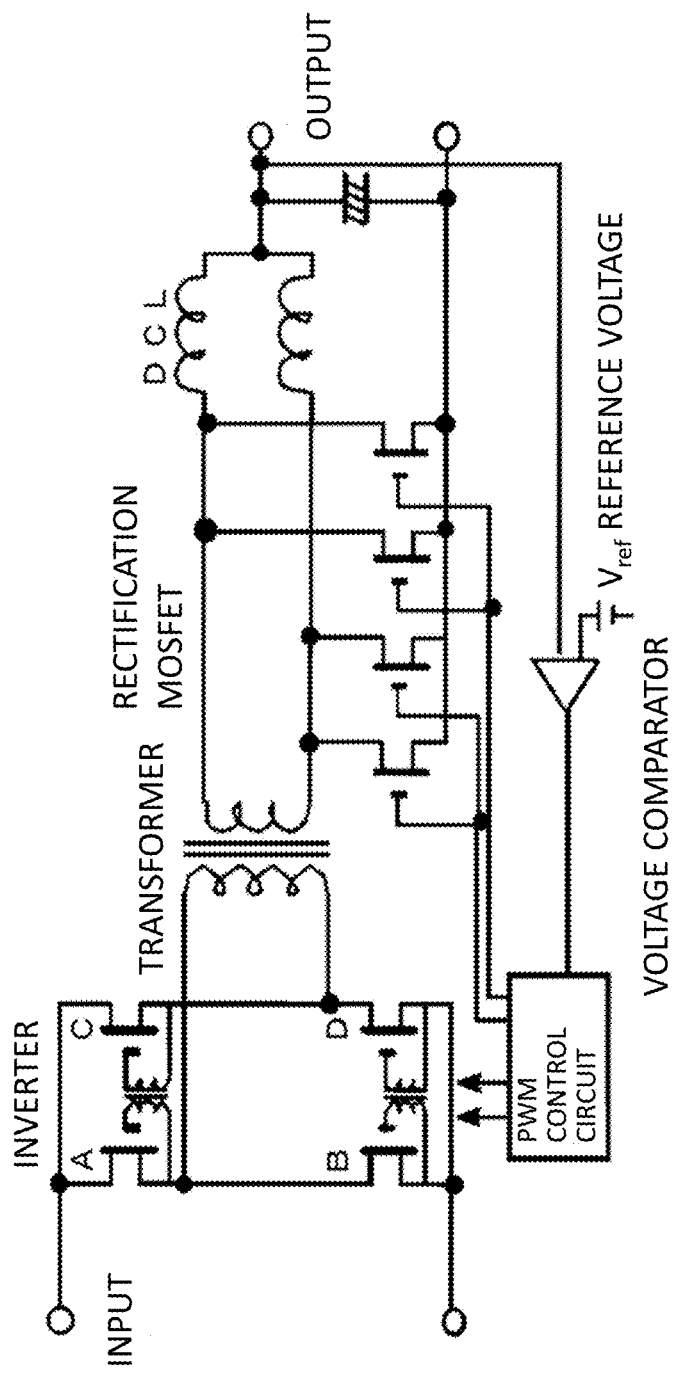
FIG. 14 is a diagram schematically illustrating a preferred example of a power supply circuit diagram of a power supply device.

In addition to the above description, the semiconductor device of the present invention is preferably used as a power module, an inverter, or a converter further using known means. Further, it is preferably used for, for example, a semiconductor system using a power supply device and the like. The power supply device may be fabricated from or as the semiconductor device by connection with a wiring pattern or the like using known means. FIG. 12 illustrates an example of the power supply system. In FIG. 12, a power supply system is configured using a plurality of power supply devices described above and a control circuit. As illustrated in FIG. 13, the power supply system may be used for a system device in combination with an electric circuit. FIG. 14 illustrates an example of a power supply circuit diagram of the power supply device. FIG. 14 illustrates a power supply circuit of a power supply device, including a power circuit and a control circuit. A DC voltage is switched at high frequencies by an inverter (configured with MOSFET A to D) to be converted to AC, followed by insulation and transformation by a transformer. The voltage is then rectified by rectification MOSFETs (A to B') and then smoothed by a DCL (smoothing coils L1 and L2) and a capacitor to output a direct current voltage. At this point, the output voltage is compared with a reference voltage by a voltage comparator to control the inverter and the rectification MOSFETs by a PWM control circuit to have a desired output voltage.

EXAMPLES

Example 1

1. Formation of n+type Semiconductor Layer
1-1. Film Formation Apparatus

Figure 5:
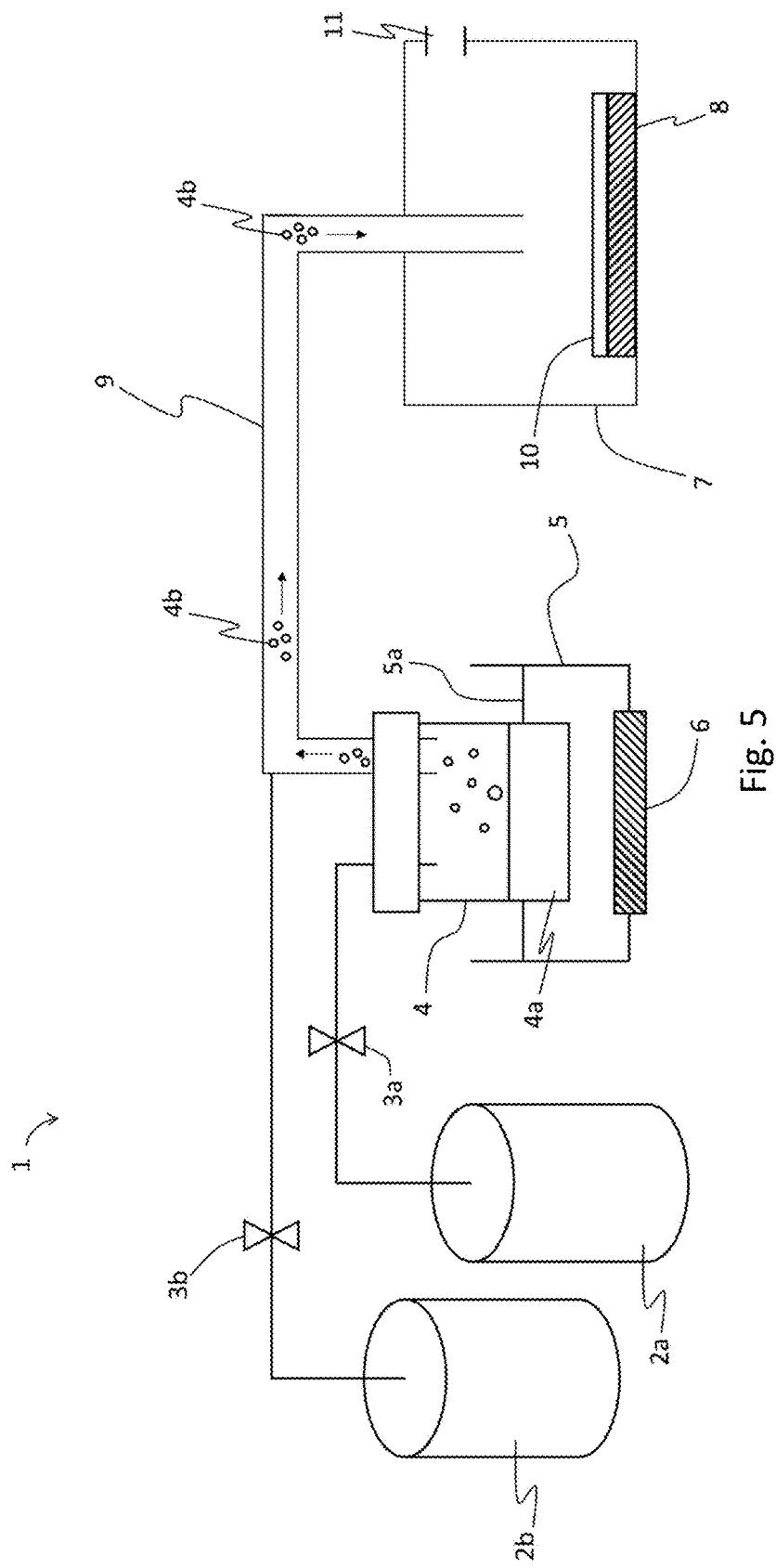
FIG. 5 is a schematic block diagram of a mist CVD apparatus used in Examples.

With reference to FIG. 5, a mist CVD apparatus 1 used in the present Example is described. The mist CVD apparatus 1 included a carrier gas source 2a to supply a carrier gas, a flow regulating valve 3a to regulate a flow rate of the carrier gas discharged from the carrier gas source 2a, a dilution carrier gas source 2b to supply a dilution carrier gas, a flow regulating valve 3b to regulate the flow rate of the dilution carrier gas discharged from the dilution carrier gas source 2b, a mist generator 4 to store a raw-material solution 4a, a container 5 to keep water 5a, an ultrasonic vibration transducer 6 mounted at a bottom of the container 5, a film formation chamber 7, a supply pipe 9 connecting the mist generator 4 to the film formation chamber 7, a hot plate 8 placed in the film formation chamber 7, and an exhaust outlet 11 to exhaust the mist, the droplets, and the exhaust gas after thermal reaction. On the hot plate 8, a substrate 10 was placed.

1-2. Preparation of Raw-Material Solution

Tin bromide was mixed to a 0.1 M aqueous gallium bromide solution, and the aqueous solution was prepared to have an atomic ratio of tin to gallium of 1:0.08. At this point, deuterated hydrobromic acid (deuterium bromide in D$_2$O) was contained at a volume ratio of 10% to make a raw-material solution.

1-3. Film Formation Preparation

The raw-material solution 4a obtained in 1-2. above was stored in the mist generator 4. As the substrate 10, a sapphire substrate was then placed on the hot plate 8. The hot plate 8 was activated to raise a temperature in the film formation chamber 7 to 470° C. The flow regulating valves 3a and 3b were then opened to supply a carrier gas from carrier gas supply means 2a and 2b as the carrier gas sources into the film formation chamber 7. After the carrier gas sufficiently substituted for the atmosphere in the film formation chamber 7, the flow rate of the carrier gas was regulated at 5.0 L/min. and the dilution carrier gas was regulated at 0.5 L/min. As the carrier gas, nitrogen was used.

1-4. Formation of Crystalline Oxide Semiconductor Film

The ultrasonic vibration transducer 6 was then vibrated at 2.4 MHz, and the vibration propagated through the water 5a to the raw-material solution 4a. By thus atomizing the raw-material solution 4a, the mist 4b was generated. The mist 4b was introduced to the film formation chamber 7 through the supply pipe 9 with the carrier gas. The mist was thermally reacted at 470° C. under atmospheric pressure in the film formation chamber 7 to form a film on the substrate 10. The film thickness was 7.5 μm and the film formation time was 180 minutes.

1-5. Evaluation

Using an XRD diffractometer, a phase of the film obtained in 1-4. above was identified and the film thus obtained was α-Ga$_2$O$_3$.

2. Formation of n-Type Semiconductor Layer
2-1. Film Formation Apparatus

Figure 6:
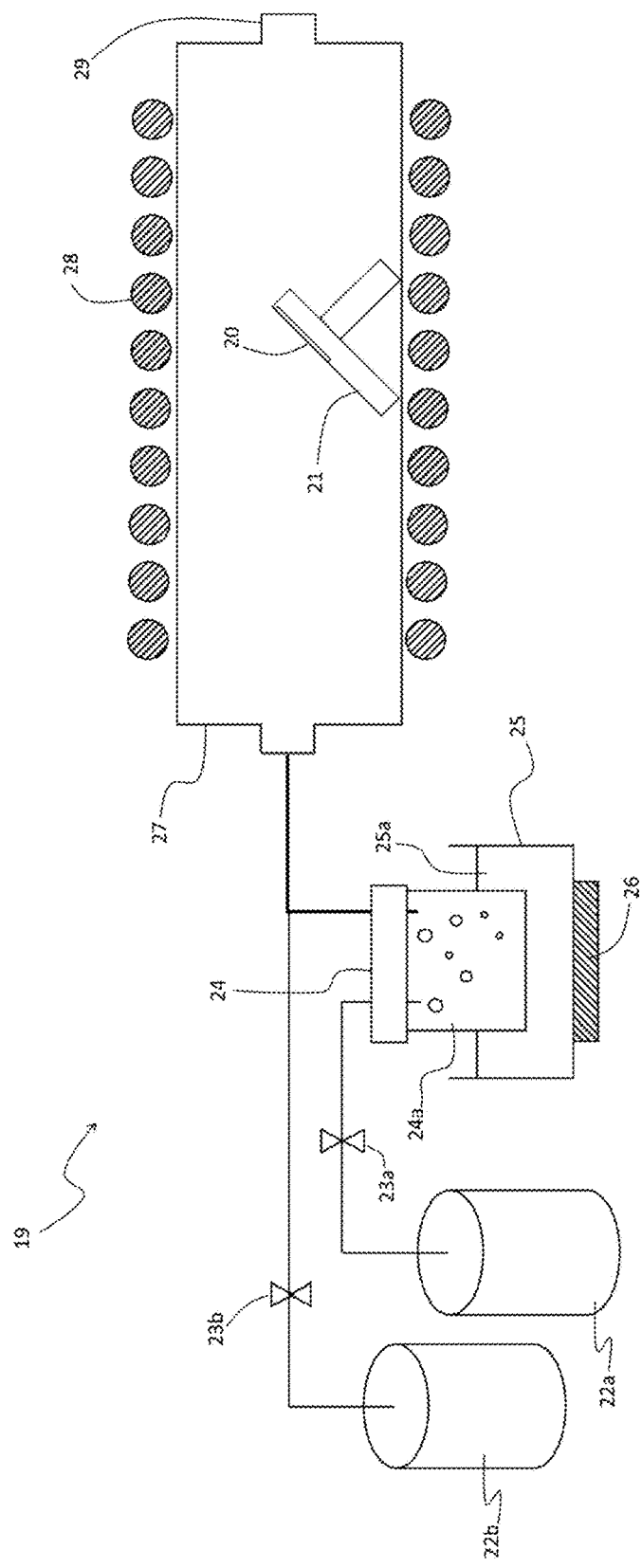
FIG. 6 is a schematic block diagram of another mist CVD apparatus used in Examples.

With reference to FIG. 6, a mist CVD apparatus 19 used in Example is described. The mist CVD apparatus 19 included a susceptor 21 to place a substrate 20, carrier gas supply means 22a to supply a carrier gas, a flow regulating valve 23a to regulate the flow rate of the carrier gas discharged from the carrier gas supply means 22a, dilution carrier gas supply means 22b to supply a dilution carrier gas, a flow regulating valve 23b to regulate the flow rate of the carrier gas discharged from the dilution carrier gas supply means 22b, a mist generator 24 to store a raw-material solution 24a, a container 25 to keep water 25a, an ultrasonic vibration transducer 26 mounted at a bottom of the container 25, a supply pipe 27 of a quartz pipe with an inner diameter of 40 mm, and a heater 28 placed surrounding the supply pipe 27. The susceptor 21 was made from quartz and had a surface to place the substrate 20 being inclined from the horizontal plane. Both the supply pipe 27 to be a film formation chamber and the susceptor 21 were made from quartz to inhibit mixing of impurities derived from the apparatus into the film formed on the substrate 20.

2-2. Preparation of Raw-Material Solution

Deuterium bromide acid was contained at a volume ratio of 20% in a 0.1 M aqueous gallium bromide solution to make a raw-material solution.

2-3. Film Formation Preparation

The raw-material solution 24a obtained in 1-2. above was stored in the mist generator 24. As the substrate 20, an n+type semiconductor film separation from a sapphire substrate was then placed on the susceptor 21. The heater 28 was activated to raise a temperature in the film formation chamber 27 to 510° C. The flow regulating valves 23a and 23b were then opened to supply a carrier gas from the carrier gas supply means 22a and 22b as the carrier gas sources into the film formation chamber 27. After the carrier gas sufficiently substituted for the atmosphere in the film formation chamber 27, the flow rate of the carrier gas was regulated at 5 L/min. and the flow rate of the dilution carrier gas was regulated at 0.5 L/min. As the carrier gas, oxygen was used.

2-4. Semiconductor Film Formation

The ultrasonic vibration transducer 26 was then vibrated at 2.4 MHz, and the vibration propagated through the water 25a to the raw-material solution 24a. By thus atomizing the raw-material solution 24a, the mist was generated. The mist was introduced to the film formation chamber 27 with the carrier gas. The mist was reacted at 510° C. under atmospheric pressure in the film formation chamber 27 to form a film on the substrate 20. The film thickness was 3.6 µm and the film formation time was 120 minutes.

2-5. Evaluation

Using an XRD diffractometer, a phase of the film obtained in 2-4. above was identified and the film thus obtained was α-$Ga_2O_3$.

3. Formation of First Metal Layer (Schottky Electrode)

As illustrated in FIG. 3, on the n-type semiconductor layer, a Pt layer, a Ti layer, and an Au layer were respectively laminated by electron beam evaporation. The Pt layer had a thickness of 10 nm, the Ti layer had a thickness of 4 nm, and the Au layer had a thickness of 175 nm.

4. Formation of Second Metal Layer (Ohmic Electrode)

As illustrated in FIG. 4, on the n+type semiconductor layer, a Ti layer and an Au layer were respectively laminated by electron beam evaporation. The Ti layer had a thickness of 35 nm and the Au layer had a thickness of 175 nm.

5. IV Measurement

Figure 7:
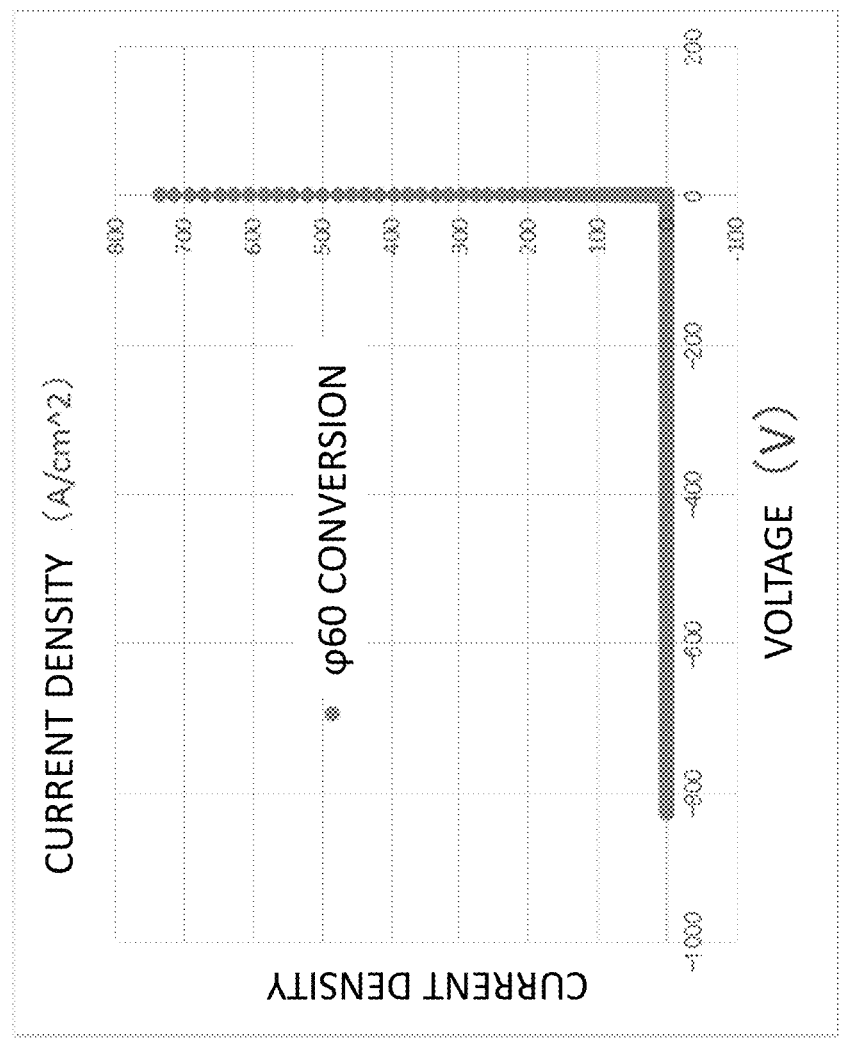
FIG. 7 is a diagram illustrating IV measurement results in Example 1.

The semiconductor device obtained as above was subjected to IV measurement. Results are illustrated in FIG. 7. The resistance voltage was checked to be found as 861 V. From the results, it is found that the semiconductor device in Example 1 is excellent in semiconductor properties and Schottky characteristics.

Example 2

Figure 8:
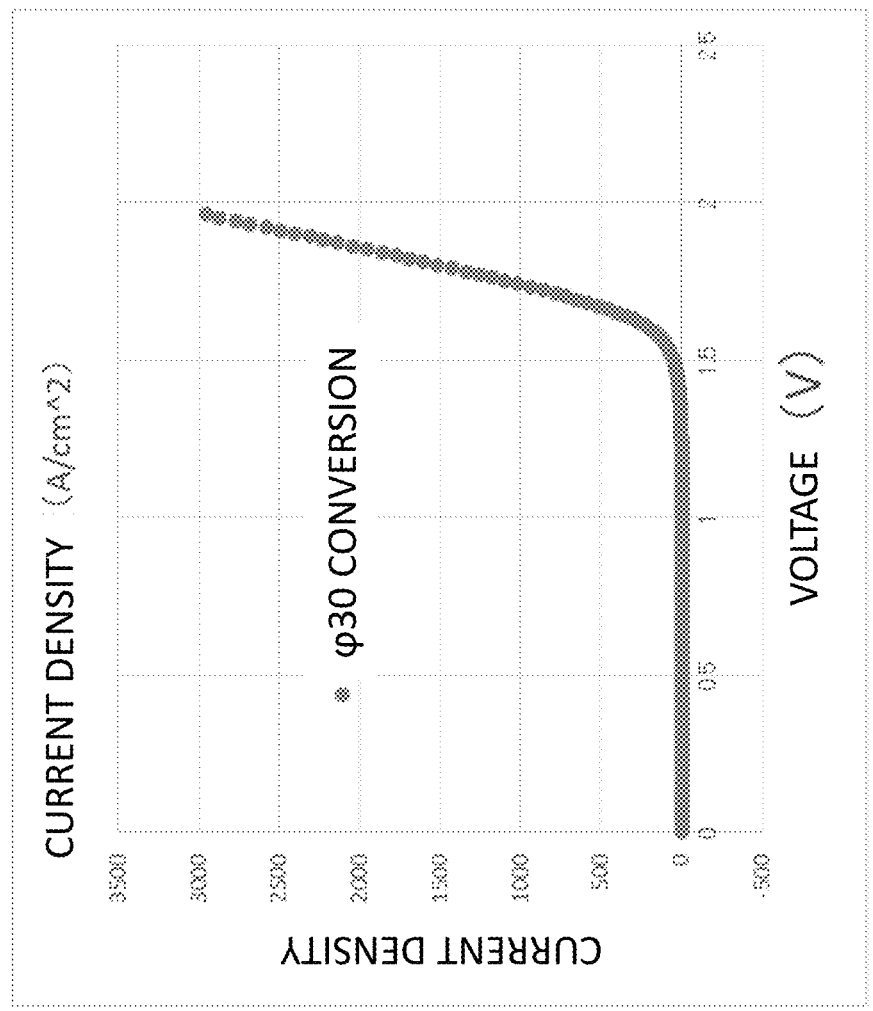
FIG. 8 is a diagram illustrating IV measurement results in Example 2.

A semiconductor device was obtained in the same manner as Example 1 other than changing, during formation of the n+type semiconductor layer, the film formation temperature to 525° C. and the film formation time to 20 minutes. The n+type semiconductor layer had a thickness of 0.5 µm. The semiconductor device thus obtained was subjected to IV measurement. Results are illustrated in FIG. 8. The on resistance (differential resistance) was checked to be found as 0.11 mΩ $cm^2$.

Example 3

Figure 9:
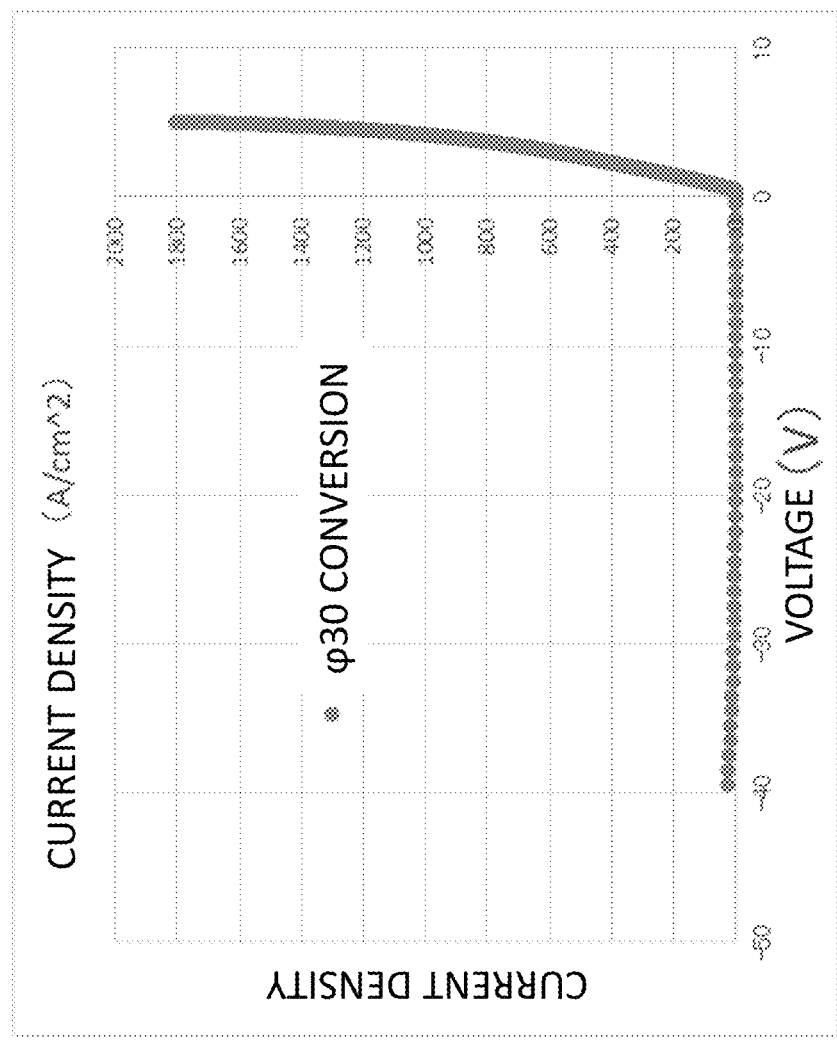
FIG. 9 is a diagram illustrating IV measurement results in Example 3.

A semiconductor device was obtained in the same manner as Example 1 other than (1) containing, during formation of the n-type semiconductor layer, deuterium bromide acid at a volume ratio of 15% in the raw-material solution and changing the film formation time to 8 hours, (2) changing, during formation of the n+type semiconductor layer, the film formation temperature to 500° C. and the film formation time to 110 minutes, and (3) laminating, during formation of the first metal layer (Schottky electrode), a Ti layer and an Au layer on the n-type semiconductor layer respectively by electron beam evaporation. The semiconductor device thus obtained was subjected to IV measurement. Results are illustrated in FIG. 9. As clearly seen from FIG. 9, it is found that good semiconductor properties and Schottky characteristics are exhibited.

Comparative Example 1

Figure 10:
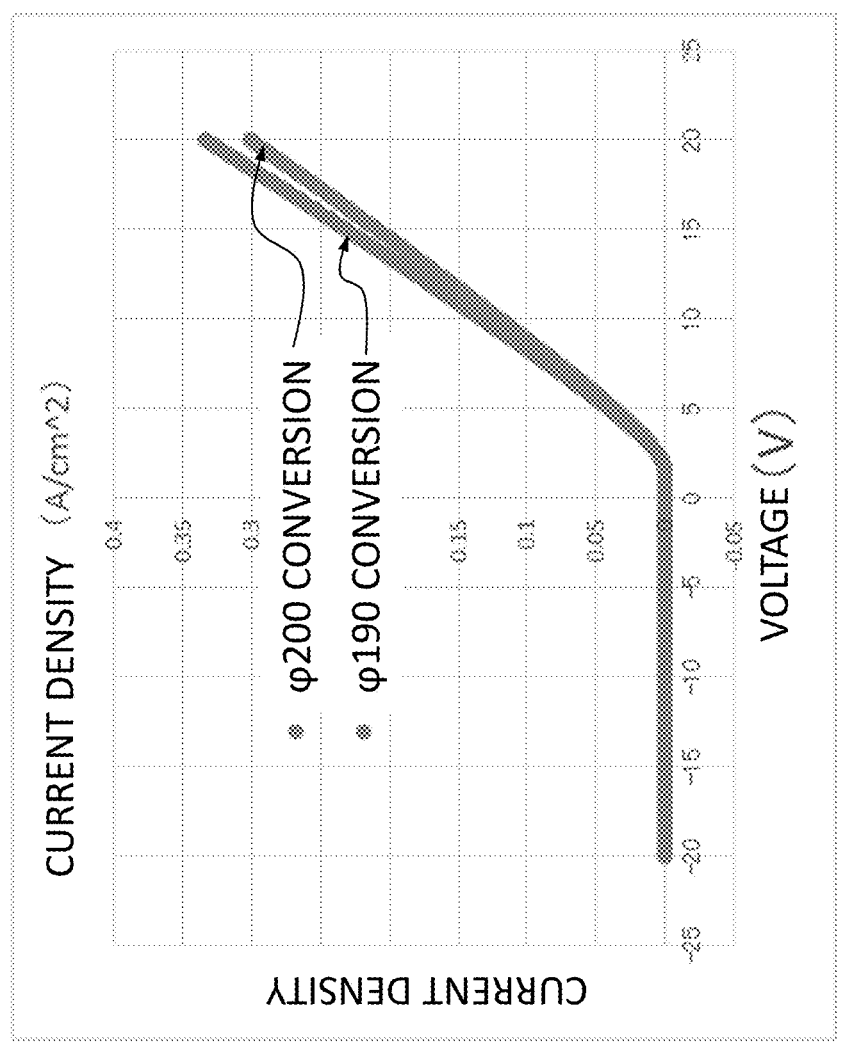
FIG. 10 is a diagram illustrating IV measurement results in Comparative Example.

For reference, IV measurement results when Pt was used for the Schottky electrode were illustrated in FIG. 10. As clearly seen from FIG. 10, it is found that semiconductor properties and Schottky characteristics are greatly impaired.

Example 4

1. Formation of n-Type Semiconductor Layer 1-1. Film Formation Apparatus

With reference to FIG. 5, a mist CVD apparatus 1 used in the present Example is described. The mist CVD apparatus 1 included a carrier gas source 2a to supply a carrier gas, a flow regulating valve 3a to regulate the flow rate of the carrier gas discharged from the carrier gas source 2a, a dilution carrier gas source 2b to supply a dilution carrier gas, a flow regulating valve 3b to regulate the flow rate of the dilution carrier gas discharged from the dilution carrier gas source 2b, a mist generator 4 to store a raw-material solution 4a, a container 5 to keep water 5a, an ultrasonic vibration transducer 6 mounted at a bottom of the container 5, a film formation chamber 7, a supply pipe 9 connecting the mist generator 4 to the film formation chamber 7, a hot plate 8 placed in the film formation chamber 7, and an exhaust outlet 11 to exhaust the mist, the droplets, and the exhaust gas after thermal reaction. On the hot plate 8, a substrate 10 was placed. In the present Example, as the substrate 10, a sapphire substrate having an Sn doped α-$Ga_2O_3$ film formed on a surface as a buffer layer was used. The sapphire substrate was grooved (groove depth of 30 µm) in a square grid at pitch interval of 1 mm using a laser machine of YVO4 laser (wavelength of 532 nm and average output of 4 W).

1-2. Preparation of Raw-Material Solution

Hydrobromic acid was contained at a volume ratio of 10% in a 0.1 M aqueous gallium bromide solution to make a raw-material solution.

1-3. Film Formation Preparation

The raw-material solution 4a obtained in 1-2. above was stored in the mist generator 4. As the substrate 10, a sapphire substrate with a buffer layer was placed on the hot plate 8. The hot plate 8 was activated to raise a temperature in the film formation chamber 7 to 470° C. The flow regulating valves 3a and 3b were then opened to supply the carrier gas from the carrier gas supply means 2a and 2b as the carrier gas sources into the film formation chamber 7. After the carrier gas sufficiently substituted for the atmosphere in the film formation chamber 7, the flow rate of the carrier gas was regulated at 2.0 L/min. and the flow rate of the dilution carrier gas was regulated at 0.5 L/min. As the carrier gas, oxygen was used.

1-4. Formation of Crystalline Oxide Semiconductor Film

The ultrasonic vibration transducer 6 was then vibrated at 2.4 MHz, and the vibration propagated through the water 5a to the raw-material solution 4a. By thus atomizing the raw-material solution 4a, the mist 4b was generated. The mist 4b was introduced to the film formation chamber 7 through the supply pipe 9 with the carrier gas. The mist was thermally reacted at 470° C. under atmospheric pressure in the film formation chamber 7 to form a film on the substrate 10. The film thickness was approximately 5 µm and the film formation time was 135 minutes.

1-5. Evaluation

Using an XRD diffractometer, a phase of the film obtained in 1-4. above was identified and the film thus obtained was α-$Ga_2O_3$.

2. Formation of n+Type Semiconductor Layer 2-1. Film Formation Apparatus

A film formation apparatus same as that used in 1-1 above was used. As the substrate 10, using the laminate obtained in 1-4 above, an n+type semiconductor layer was laminated on the n-type semiconductor layer.

2-2. Preparation of Raw-Material Solution

Tin bromide was mixed to a 0.1 M aqueous gallium bromide solution, and the aqueous solution was prepared to have an atomic ratio of tin to gallium of 1:0.08. At this point, deuterium bromide acid was contained at a volume ratio of 10% to make a raw-material solution.

2-3. Film Formation Preparation

The raw-material solution 4a obtained in 2-2. above was stored in the mist generator 4. As the substrate 10, a sapphire substrate with a buffer layer was then placed on the hot plate 8. The hot plate 8 was activated to raise a temperature in the film formation chamber 7 to 450° C. The flow regulating valves 3a and 3b were then opened to supply the carrier gas from the carrier gas supply means 2a and 2b to the film formation chamber 7. After the carrier gas sufficiently substituted for the atmosphere in the film formation chamber 7, the flow rate of the carrier gas was regulated at 2.0 L/min. and the flow rate of the dilution carrier gas was regulated at 0.5 L/min. As the carrier gas, nitrogen was used.

2-4. Formation of Crystalline Oxide Semiconductor Film

The ultrasonic vibration transducer 6 was then vibrated at 2.4 MHz, and the vibration propagated through the water 5a to the raw-material solution 4a. By thus atomizing the raw-material solution 4a, the mist 4b was generated. The mist 4b was introduced to the film formation chamber 7 through the supply pipe 9 with the carrier gas. The mist was thermally reacted at 450° C. under atmospheric pressure in the film formation chamber 7 to form a film on the substrate 10. The film thickness was approximately 2.9 µm and the film formation time was 120 minutes.

2-5. Evaluation

Using an XRD diffractometer, a phase of the film obtained in 2-4. above was identified and the film thus obtained was α-$Ga_2O_3$.

3. Formation of Ohmic Electrode

On the n+type semiconductor layer of the laminate obtained in 2-4. above, a Ti film (thickness of 70 nm) and an Au film (thickness of 30 nm) were respectively formed by sputtering to make an ohmic electrode.

4. Substrate Removal

On the ohmic electrode of the laminate obtained in 3. above, a provisional wafer was temporarily joined. Using a CMP apparatus, the substrate 10 was then polished to remove the sapphire substrate and the buffer layer.

5. Formation of Schottky Electrode

On the n-type semiconductor layer of the laminate obtained in 4. above, a Cr film (thickness of 50 nm) and an Al film (thickness of 5000 nm) were respectively formed by EB evaporation to make a Schottky electrode (diameter of 300 µm). It was then packaged in TO 220 to obtain an implemented SBD.

6. Semiconductor Property Evaluation (Switching Characteristic Evaluation)

Figure 11:
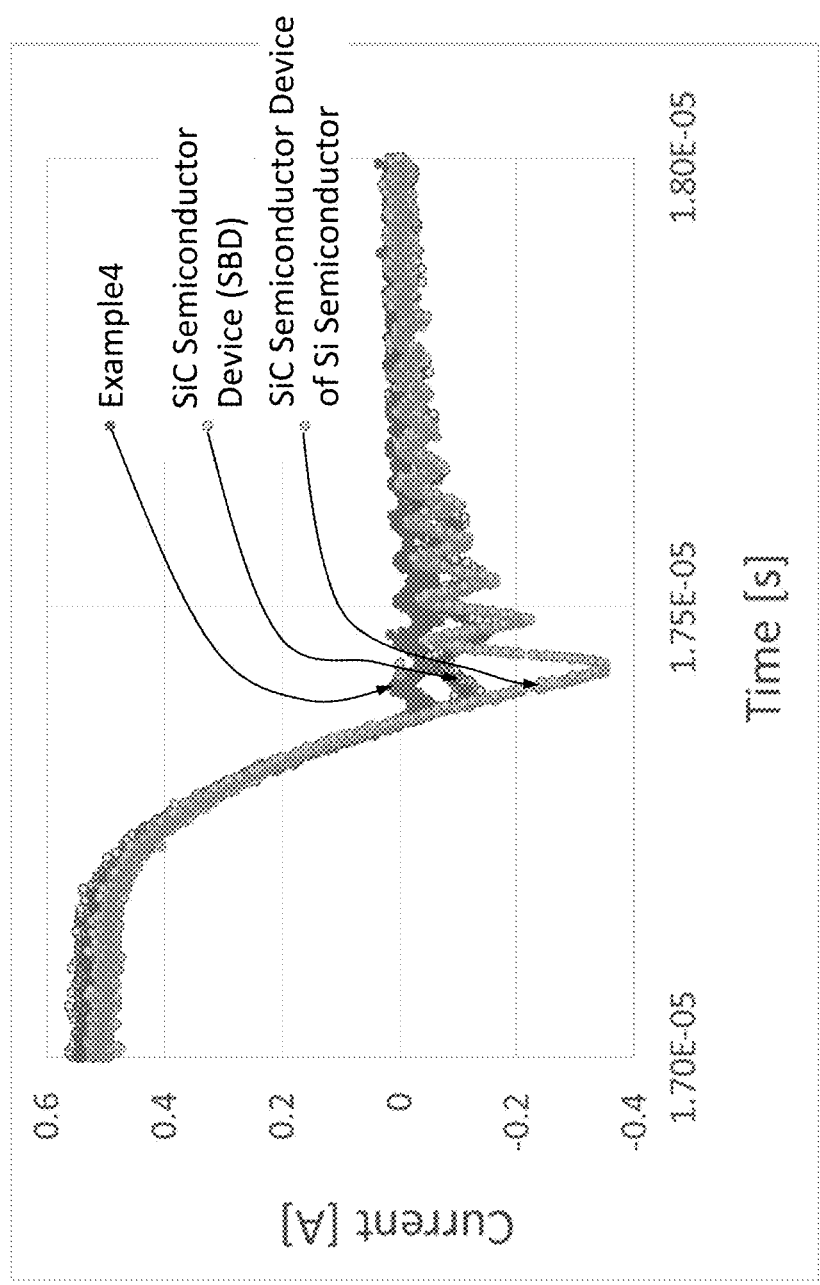
FIG. 11 is a diagram illustrating switching characteristics measurement results in Example 4, where the ordinate represents a current (A) and the abscissa represents time (seconds).

The switching characteristics of the SBD obtained in 5. above were evaluated. Results are illustrated in FIG. 11. The switching characteristics in the cases of using SiC as a semiconductor and using Si as a semiconductor were also illustrated in FIG. 11. As clearly seen from FIG. 11, it is found that a product of the present invention is excellent in switching characteristics compared with other products.

(Thermal Resistance Property Evaluation)

The SBD obtained in 5. above was subjected to thermal resistance measurement. As a result, the product of the present invention had RjC of 13.9° C./W, which was performance equivalent to or greater than that (RjC=12.5° C./W) of using SiC as a semiconductor. Considering the thermal resistance per unit area, it is found that the product in a chip size of as small as approximately 60% of one using SiC as a semiconductor can exhibit equivalent performance to the one using SiC.

(Capacitance Measurement)

The SBD obtained in 5. above was subjected to CV measurement (1 MHz). As a result, a capacitance of the SBD was 130 pF at 0 V bias. This shows less capacitance than one using SiC as a semiconductor, and it is found that the product of the present invention has good switching characteristics.

(Thermal Resistance Calculation Evaluation)

For the SBD obtained in 5. above, thermal resistance was calculated to be 15.6 (K/W). The case of the present invention (Example 4) was compared and evaluated with cases of having thermal resistance of 15.6 (K/W) and using β-$Ga_2O_3$ (Comparative Example 2) and using SiC (Comparative Example 3) for a semiconductor layer. Results are shown in Table 1. As clearly seen from Table 1, the product of the present invention shows good thermal resistance properties even when it has a smaller surface area of the semiconductor layer and a thickness of 0.01 mm or less compared with the products of Comparative Examples, and it is found that this product is suitable for downsizing of a semiconductor device.

TABLE 1

| | Semiconductor Layer | | |
| --- | --- | --- | --- |
| | Type of Semiconductor | Thickness of Semiconductor Layer (mm) | Size (mm square) |
| Example 4 | α-$Ga_2O_3$ | 0.01 | 0.8 |
| Comparative Example 2 | β-$Ga_2O_3$ | 0.2 | 0.8 |
| Comparative Example 3 | SiC | 0.3 | 1.6 |

Example 5

An SBD was obtained in the same manner as Example 4 other than using a Schottky electrode with a diameter of 500 µm instead of the one having a diameter of 300 µm. The switching characteristics of the SBD thus obtained were evaluated and a waveform same as that in Example 4, and it is thus found to have good switching characteristics.

Example 6

Figure 15C:
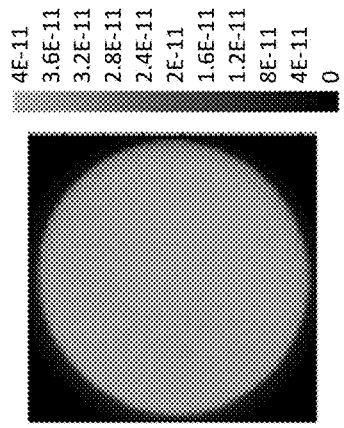
FIGS. 15A-15C are an image illustrating SIPM measurement results in Example 6.
Figure 15B:
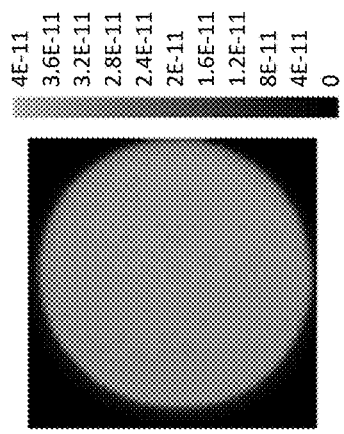
Figure 15A:
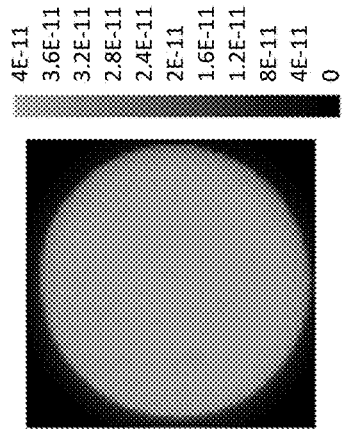
Figure 16:
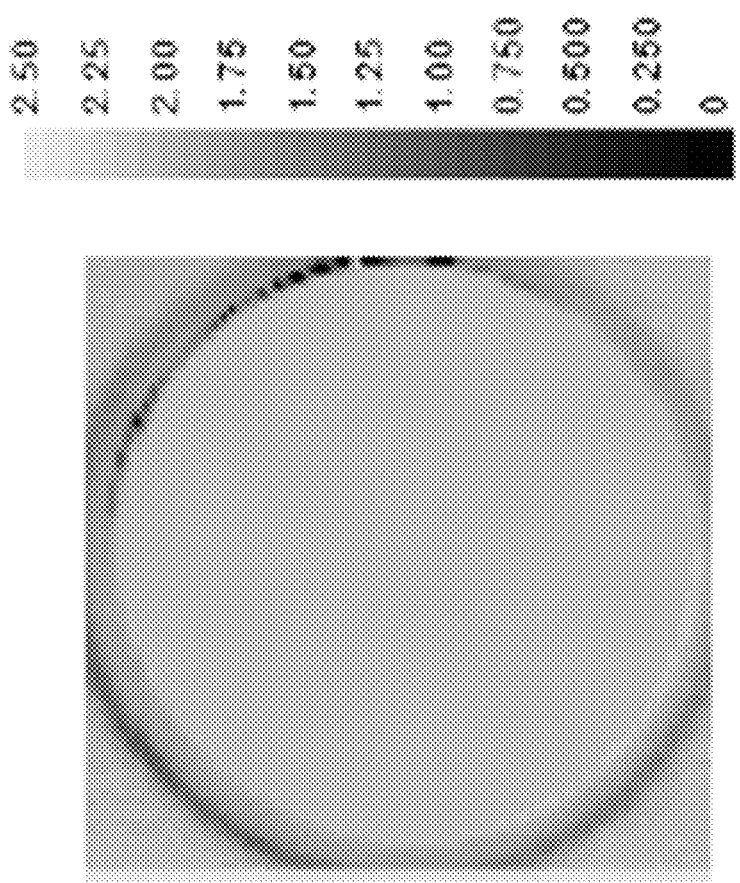
FIG. 16 is an image illustrating SIPM measurement results in Example 6.

A semiconductor device was obtained in the same manner as Example 1 other than (1) changing, during formation of the n-type semiconductor layer, the film formation temperature to 520° C. and the film formation time to 25 minutes, (2) changing, during formation of the n+type semiconductor layer, the raw-material solution to the mixed solution of 0.05M gallium acetylacetonate, hydrochloric acid at a volume ratio of 1.5%, tin chloride(II) at an atomic ratio of 0.2% and water, the film formation temperature to 480° C., the film formation time to 150 minutes, and the mist CVD apparatus to the mist CVD apparatus 19 in FIG. 6, (3) laminating, during formation of the first metal layer (Schottky electrode), a Ti layer on the n-type semiconductor layer as the first metal layer by electron beam evaporation. Furthermore, the ohmic electrode was formed on the n+type semiconductor layer, and a Cu layer was formed on the Ti layer by electron beam evaporation as a cover electrode. The semiconductor device thus obtained was subjected to scanning internal photoemission microscopy (SIPM) measurement. SIPM images are illustrated in FIGS. 15A to 15C and FIG. 16. FIGS. 15A to 15C shows a photo yield map; FIG. 15A before annealing, FIG. 15B after 200° C. annealing, and FIG. 15C after 300° C. annealing. As seen from FIGS. 15A to 15C, it is found that In-plane distribution of the photo yield is uniform and superior in thermal stability. FIG. 16 shows the Schottky barrier height map. As seen from FIG. 16, it is found that the In-plane distribution of the barrier height is uniform.

Example 7

Figure 17A:
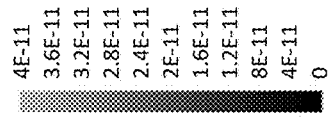
FIGS. 17A-17C are an image illustrating SIPM measurement results in Example 7.
Figure 17B:
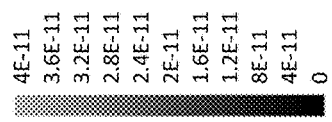
Figure 17C:
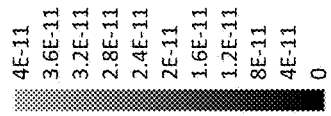
Figure 18:
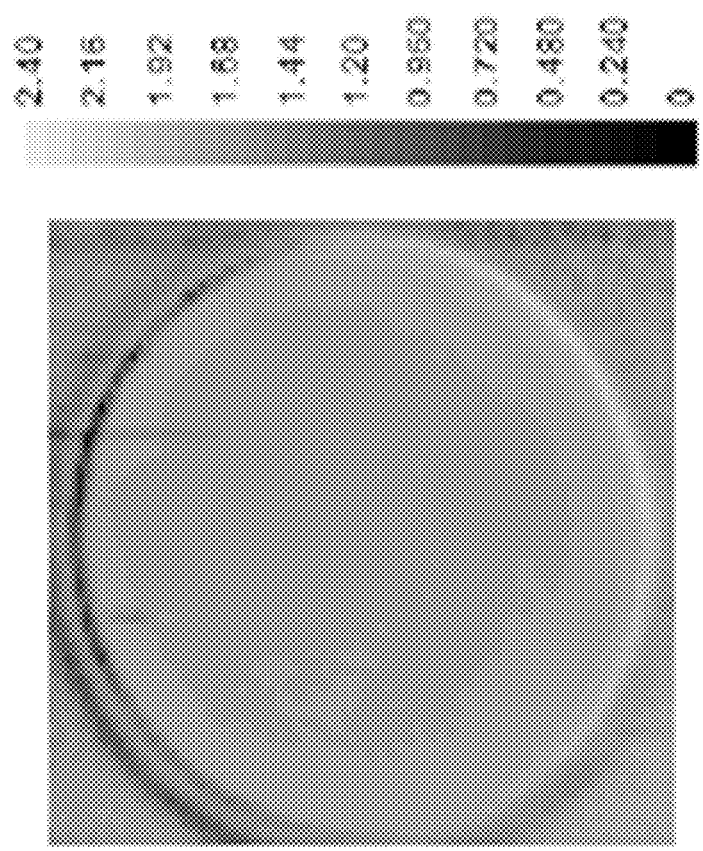
FIG. 18 is an image illustrating SIPM measurement results in Example 7.

A semiconductor device was obtained in the same manner as Example 6 other than laminating, during formation of the first metal layer (Schottky electrode), a Fe layer on the n-type semiconductor layer as the first metal layer. Furthermore, the ohmic electrode was formed on the n+type semiconductor layer, and a Ti layer and a Cu layer were formed on the Fe layer respectively by electron beam evaporation as a cover electrode. The semiconductor device thus obtained was subjected to scanning internal photoemission microscopy (SIPM) measurement, in the same manner as Example 6. SIPM images are illustrated in FIGS. 17A to 17C and FIG. 18. FIGS. 17A to 17C shows a photo yield map; FIG. 17A before annealing, FIG. 17B after 200° C. annealing, and FIG. 17C after 300° C. annealing. As seen from FIGS. 17A to 17C, it is found that In-plane distribution of the photo yield is uniform with and superior in thermal stability. FIG. 18 shows the Schottky barrier height map. As seen from FIG. 18, it is found that the In-plane distribution of the barrier height is uniform.

As just described, it is found that the semiconductor device of the present invention is excellent in semiconductor properties and Schottky characteristics.

INDUSTRIAL APPLICABILITY

The semiconductor device of the present invention is applicable in any field, such as semiconductors (e.g., compound semiconductor electronic devices, etc.), electronics and electric device components, optical and electronic photography related devices, and industrial parts, and particularly useful for power devices.

REFERENCE SIGNS LIST

1 Mist CVD Apparatus
2a Carrier Gas Source
2b Dilution Carrier Gas Source
3a Flow Regulating Valve
3b Flow Regulating Valve
4 Mist Generator
4a Raw-Material Solution
4b Mist
5 Container
5a Water
6 Ultrasonic Vibration Transducer
7 Film Formation Chamber
8 Hot Plate
9 Supply Pipe
10 Substrate
11 Exhaust Outlet
19 Mist CVD Apparatus
20 Substrate
21 Susceptor
22a Carrier Gas Supply Means
22b Dilution Carrier Gas Supply Means
23a Flow Regulating Valve
23b Flow Regulating Valve
24 Mist Generator
24a Raw-Material Solution
25 Container
25a Water
26 Ultrasonic Vibration Transducer
27 Supply Pipe
28 Heater
29 Exhaust Outlet
50a First Metal Layer
50b Second Metal Layer
51 Au Layer
52 Ti Layer
53 Pt Layer
54 Ti Layer
55 Au Layer
101a n-type Semiconductor Layer
101b n+type Semiconductor Layer
104 Insulating Layer
105a Schottky Electrode
105b Ohmic Electrode While illustrative embodiments have been illustrated and described, it will be appreciated that various changes can be made therein without departing from the spirit and scope of the invention.

The embodiments of the invention in which an exclusive property or privilege is claimed are defined as follows:

1. A semiconductor device, comprising:
  a semiconductor layer containing a crystalline oxide semiconductor with a corundum structure as a major component; and
  a Schottky electrode on the semiconductor layer,
  the Schottky electrode comprising two or more metal layers and containing at least one metal selected from Group 4 of the periodic table.

2. The semiconductor device of claim 1, comprising:
  a first semiconductor layer;
  a second semiconductor layer; and
  a Schottky electrode on the first semiconductor layer, wherein each of the first semiconductor layer and the second semiconductor layer contains a crystalline oxide semiconductor with a corundum structure as a major component, and the first semiconductor layer has a carrier concentration less than a carrier concentration of the second semiconductor layer.

3. The semiconductor device of claim 1, wherein the metal is a transition metal of the fourth period of the periodic table.

4. The semiconductor device of claim 1, wherein the crystalline oxide semiconductor contains gallium or indium.

5. The semiconductor device of claim 1, wherein the crystalline oxide semiconductor is $\alpha$-$Ga_2O_3$ or a mixed crystal thereof.

6. The semiconductor device of claim 1, further comprising an ohmic electrode, wherein the ohmic electrode contains a metal of Group 4 or 11 of the periodic table.

7. The semiconductor device of claim 1,
wherein the semiconductor layer has a thickness of 40 μm or less.

8. The semiconductor device of claim 7, wherein the semiconductor device shows capacitance of 1000 pF or less at 0 V bias when measured at 1 MHz.

9. The semiconductor device of claim 7, wherein the semiconductor layer has a surface area of 1 $mm^2$ or less.

10. The semiconductor device of claim 7, wherein the Schottky electrode has an area of 1 $mm^2$ or less.

11. The semiconductor device of claim 7, wherein the semiconductor device is configured to be operated with current of 1 A or more.

12. The semiconductor device of claim 1, wherein the semiconductor device is a power device.

13. The semiconductor device of claim 1, wherein the semiconductor device is a power module, an inverter, or a converter.

14. The semiconductor device of claim 1, wherein the two or more metal layers comprised in the Schottky electrode comprise a Ti layer.

15. The semiconductor device of claim 1, wherein the two or more metal layers comprised in the Schottky electrode comprise a Pt layer.

16. The semiconductor device of claim 1, wherein the two or more metal layers comprised in the Schottky electrode comprise an Au layer.

17. The semiconductor device of claim 14, wherein the Ti layer is in a range of 1 nm to 500 μm in thickness.

18. A semiconductor system comprising: the semiconductor device of claim 1.

19. A semiconductor device comprising:
a semiconductor layer comprising a crystalline oxide semiconductor with a corundum structure;
a Schottky electrode electrically connected to the semiconductor layer; and
an ohmic electrode electrically connected to the semiconductor layer,
the crystalline oxide semiconductor with the corundum structure of the semiconductor layer comprising gallium, and
the Schottky electrode comprising two or more metal layers and comprising at least one metal selected from among metals of Group 4 of the periodic table.

20. The semiconductor device of claim 19, wherein
the semiconductor layer comprises a first semiconductor layer and a second semiconductor layer, and
the Schottky electrode is arranged on the first semiconductor layer.

21. The semiconductor device of claim 20, wherein
the first semiconductor layer comprises a carrier concentration,
the second semiconductor layer comprises a carrier concentration, and
the carrier concentration of the first semiconductor layer is lower than the carrier concentration of the second semiconductor layer.

* * * * *